United States Patent
Hung

(10) Patent No.: US 10,062,577 B1
(45) Date of Patent: Aug. 28, 2018

(54) METHOD OF FABRICATING III-V FIN STRUCTURES AND SEMICONDUCTOR DEVICE WITH III-V FIN STRUCTURES

(71) Applicant: UNITED MICROELECTRONICS CORP., Hsin-Chu (TW)

(72) Inventor: Ching-Wen Hung, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/647,232

(22) Filed: Jul. 11, 2017

(51) Int. Cl.
| | |
|---|---|
| *H01L 21/3105* | (2006.01) |
| *H01L 29/06* | (2006.01) |
| *H01L 29/20* | (2006.01) |
| *H01L 29/16* | (2006.01) |
| *H01L 21/762* | (2006.01) |
| *H01L 21/02* | (2006.01) |
| *H01L 21/308* | (2006.01) |

(52) U.S. Cl.
CPC .. *H01L 21/31051* (2013.01); *H01L 21/02538* (2013.01); *H01L 21/3085* (2013.01); *H01L 21/76224* (2013.01); *H01L 29/0649* (2013.01); *H01L 29/0657* (2013.01); *H01L 29/16* (2013.01); *H01L 29/20* (2013.01)

(58) Field of Classification Search
CPC . H01L 29/0649; H01L 29/0657; H01L 29/16; H01L 29/20; H01L 21/02538; H01L 21/3085; H01L 21/76224; H01L 21/31051
See application file for complete search history.

(56) References Cited

U.S. PATENT DOCUMENTS

| | | | |
|---|---|---|---|
| 8,148,269 B2 | 4/2012 | Balseanu | |
| 8,716,156 B1 * | 5/2014 | Pawlak | H01L 21/82382 438/770 |
| 8,987,835 B2 | 3/2015 | Vellianitis | |
| 9,275,854 B2 | 3/2016 | Cheng | |
| 9,312,344 B2 | 4/2016 | Holland | |
| 9,337,109 B2 | 5/2016 | Doornbos | |
| 9,570,443 B1 | 2/2017 | Balakrishnan | |
| 9,595,613 B1 * | 3/2017 | Cheng | H01L 29/785 |
| 2008/0157130 A1 * | 7/2008 | Chang | H01L 29/66795 257/288 |
| 2009/0026505 A1 * | 1/2009 | Okano | H01L 29/66795 257/255 |

* cited by examiner

*Primary Examiner* — Andrew Q Tran
(74) *Attorney, Agent, or Firm* — Winston Hsu

(57) ABSTRACT

A method of fabricating III-V fin structures includes providing numerous fins. Then, a group III-V material layer is formed to encapsulate an upper portion of each of the fins. Later, part of the group III-V material layer is removed to expose an end of each of the fins, and divides the group III-V material layer into numerous U-shaped structures. Next, a first part of each of the fins and the entire silicon oxide layer are removed. Finally, part of each of the U-shaped structures is removed to segment each of the U-shaped structures into two III-V fin structures.

11 Claims, 6 Drawing Sheets

US 10,062,577 B1

METHOD OF FABRICATING III-V FIN STRUCTURES AND SEMICONDUCTOR DEVICE WITH III-V FIN STRUCTURES

BACKGROUND OF THE INVENTION

1. Field of the Invention

The present invention relates to a method of fabricating III-V fin structures, and more particularly to fabricating III-V fin structures by using fins as mandrels.

2. Description of the Prior Art

The desire for improved performance and reduced cost of manufacturing has driven integrated circuit designs to extreme integration densities and small feature sizes. Fin-FETs are provided for high density of integration. The main focus in recent years has been on increasing the mobility and transistor drive current.

Group III-V materials are good candidates for forming transistors due to their high electron mobility. Therefore, III-V based transistors have been explored. Group III-V semiconductor materials need to be grown on other substrates because it is difficult to obtain bulk III-V crystals. The growth of III-V compound semiconductor films on dissimilar substrates faces difficulties because these substrates have lattice constants and thermal expansion coefficients different from those of the III-V compound semiconductors.

SUMMARY OF THE INVENTION

In view of the above, it would be an advantage in the art to provide a new method for forming high quality III-V materials.

According to a preferred embodiment of the present invention, a method of fabricating III-V fin structures includes providing numerous fins and numerous STIs, wherein each of the fins are sandwiched by two of the STIs. Then, a deposition process is performed to conformally form a group III-V material layer encapsulating an upper portion of each of the fins and covering the STIs. Later, part of the group III-V material layer is removed to expose an end of each of the fins, and divide the group III-V material layer into numerous U-shaped structures. Next, a first part of each of the fins is removed. Finally, part of each of the U-shaped structures is removed to divide each of the U-shaped structures into two III-V fin structures.

According to a preferred embodiment of the present invention, a semiconductor device with III-V fin structures includes numerous fins and numerous STIs. Each of the STIs is disposed between the fins. Numerous III-V fin structures, wherein each of the STIs has two III-V fin structures disposed thereon. Numerous isolating structures are disposed on the fins and STIs, and between the III-V fin structures, wherein an upper portion of each of the III-V fin structures protrudes from the isolating structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 11 depict a method of fabricating III-V fin structures according to a first preferred embodiment of the present invention, wherein:

FIG. 1 depicts a stage of providing a substrate with STIs and fins.
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4;
FIG. 6 is a fabricating stage following FIG. 5;
FIG. 7 is a fabricating stage following FIG. 6;
FIG. 8 is a fabricating stage following FIG. 7;
FIG. 9 is a fabricating stage following FIG. 8;
FIG. 10 is a fabricating stage following FIG. 9;
and
FIG. 11 is a fabricating stage following FIG. 10.

DETAILED DESCRIPTION

Figure 1:
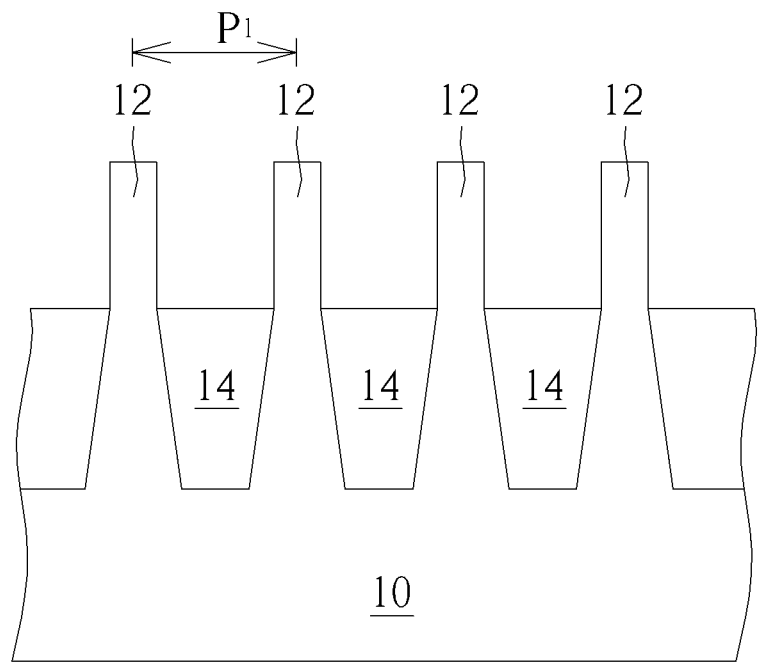

FIG. 1 to FIG. 11 depict a method of fabricating III-V fin structures according to a first preferred embodiment of the present invention. As shown in FIG. 1, a substrate 10 is provided. Numerous fins 12 extend from the substrate 10. The fins 12 and the substrate 10 are integral. The pitch of the fins is marked as $P_1$. Numerous STIs 14 are disposed on the substrate 10, and each of the fins 12 is sandwiched by two of the STIs 14. An upper portion of each of the fins 12 protrudes from the top surface of each of the STIs 14. The substrate 10 is composed of at least one semiconductor material. In one embodiment, the entirety of the substrate 10 comprises a semiconductor material including silicon (Si), germanium (Ge), silicon germanium (SiGe), silicon carbide (SiC), silicon-germanium-carbon (SiGeC), or group III-V material. In a preferred embodiment of the present application, the substrate 10 is made of silicon. The STIs is made of silicon oxide or silicon nitride.

Figure 2:
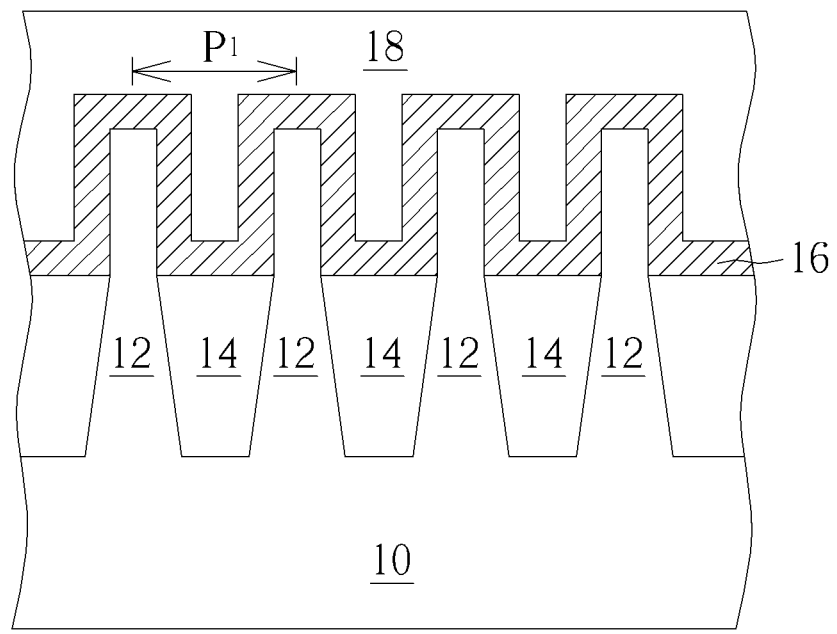

As shown in FIG. 2, a deposition process is performed to conformally form a group III-V material layer 16 encapsulating the upper portion of each of the fins 12 and covering the STIs 14. The deposition process may be an atomic layer deposition process, a chemical vapor deposition process or a physical vapor deposition process. The term "III-V" refers to semiconductors having at least one group III element and at least one group V element. Typically, the group III-V material layer 16 is a binary, ternary, or quaternary III-V containing compound. An exemplary group III-V material layer 16 described herein can include, but is not limited to, gallium phosphide (GaP), gallium arsenide (GaAs), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium arsenide antimony phosphide (InAsSbP), indium gallium aluminum phosphide (InGaAlP) or combinations of the foregoing. Other examples of the group III-V material layer 16 that can be used in the exemplary embodiments disclosed herein include, but are not limited to, alloys of indium aluminum arsenide (InAlAs), indium aluminum arsenide antimony (InAlAsSb), indium aluminum arsenide phosphide (InAlAsP), or indium gallium arsenide phosphide (InGaAsP).

Figure 3:
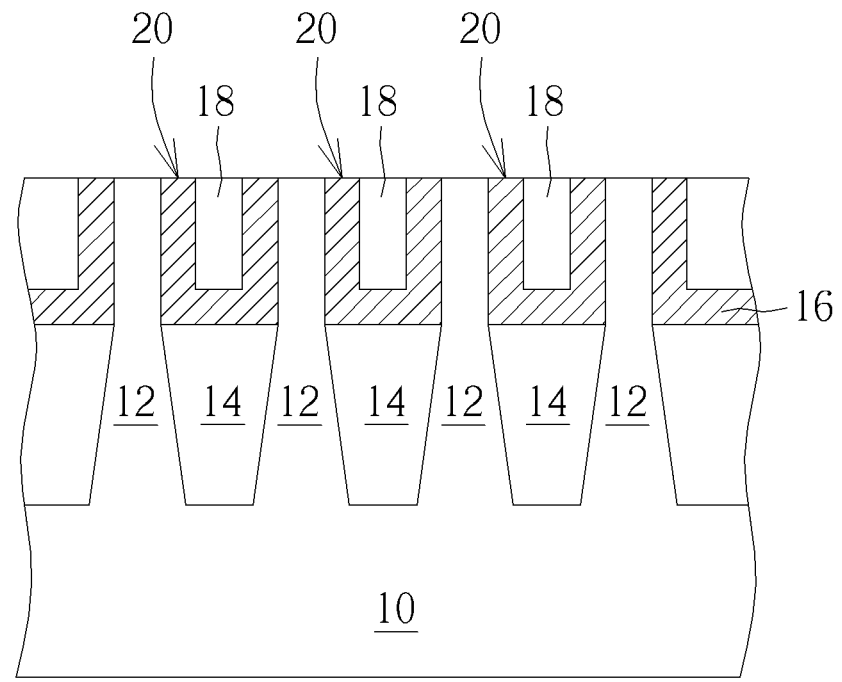

Later, a silicon oxide layer 18 is formed to cover the group III-V material layer 16. As shown in FIG. 3, the silicon oxide layer 18 and the group III-V material layer 16 are planarized by taking an end of each of the fins 12 as a stop layer to remove part of the group III-V material layer 16, expose the end of each of the fins 12, and divide the group III-V material layer 16 into numerous U-shaped structures 20. In detail, each of the STIs 14 is overlapped by one of the U-shaped structures 20. The planarization of the silicon oxide layer 18 and the group III-V material layer 16 may be a chemical mechanical planarization process.

Figure 4:
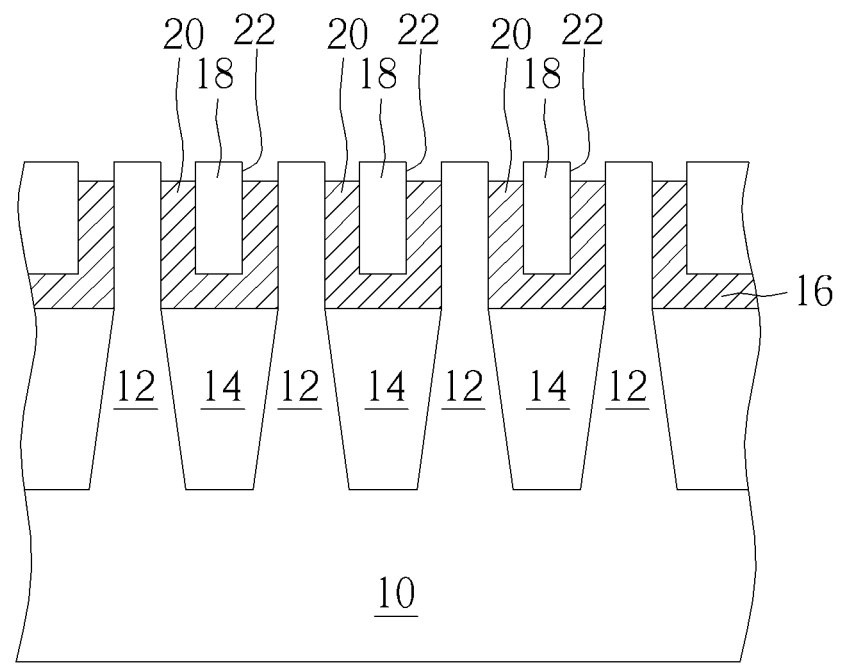
Figure 5:
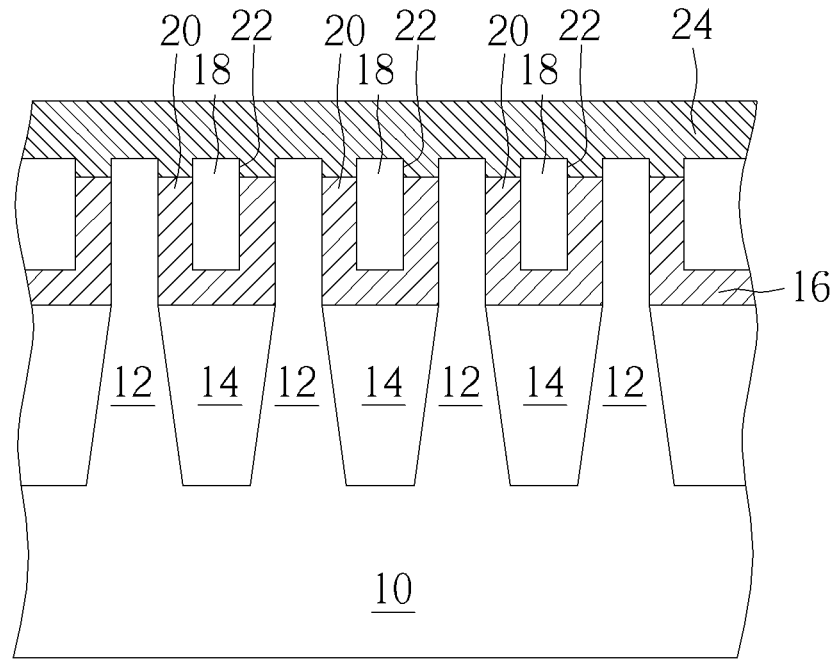
Figure 6:
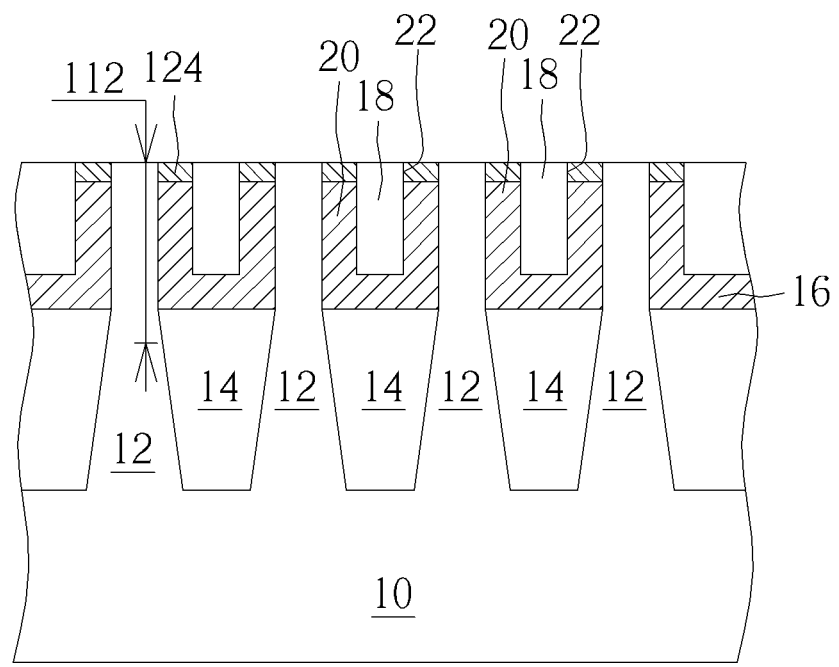

As shown in FIG. 4, two ends of each of the U-shaped structures 20 are shortened to form recesses 22 between the silicon oxide layer 18 and each of the fins 12. The U-shaped structures 20 can be shorted by an etching process. As shown in FIG. 5, a hard mask layer 24 is formed to cover the silicon oxide layer 18, the fins 12 and fill up the recesses 22. As shown in FIG. 6, the hard mask layer 24 is planarized by taking the end of each of the fins 12 as a stop layer. After the planarization, the hard mask layer 24 is divided into numerous hard masks 124 to respectively fill up each of the recesses 22. Each of the hard masks 124 is therefore disposed at the end of each of the U-shaped structures 20. The hard masks 124 may be silicon nitride.

Figure 7:
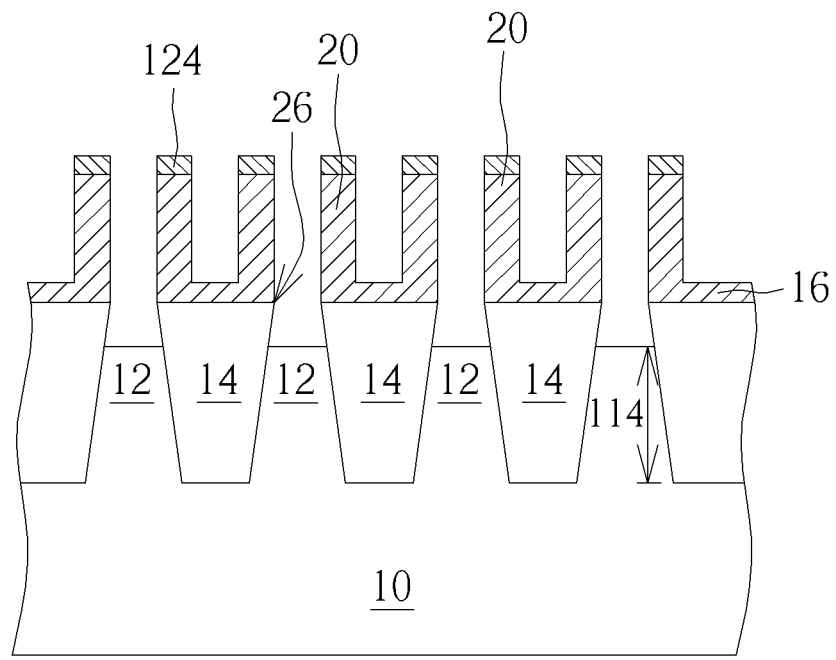

As shown in FIG. 7, the silicon oxide layer 18 is removed and part of the fins 12 is removed. For example, the silicon oxide layer 18 is removed entirely. Later, a first part 112 of each of the fins 12 is removed while a second part 114 of each of the fins 12 remains. The sequence of removing the silicon oxide layer 18 and the fins 12 can be exchanged. The position of the first part 112 of each of the fins 12 is shown in FIG. 6. The second part 114 of each of the fins 12 is lower than the interface 26 between the group III-V material layer 16 and the STIs 14. The silicon oxide layer 18 and first part 112 of each of the fins 12 is preferably removed by a dry etching process.

Figure 8:
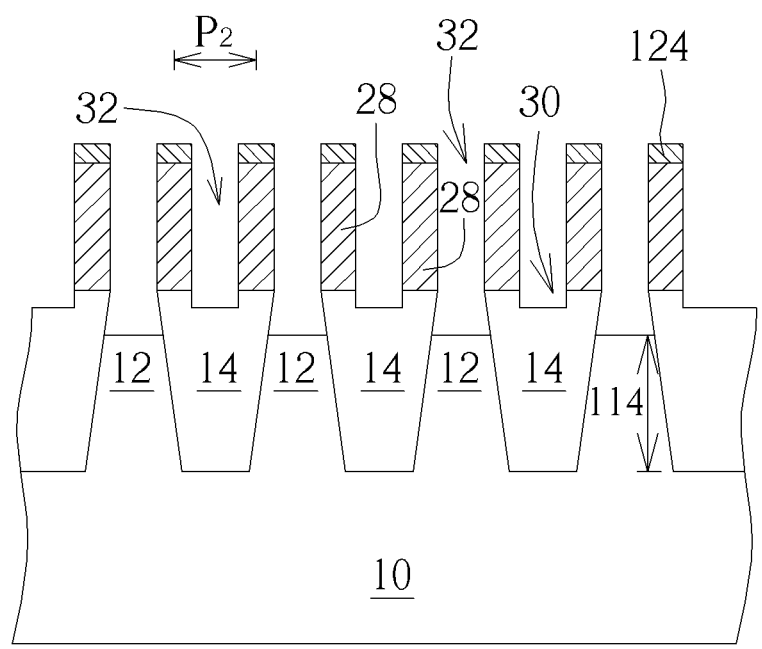

As shown in FIG. 7 and FIG. 8, part of each of the U-shaped structures 20 is removed to segment each of the U-shaped structures 20 into two III-V fin structures 28. In detail, the middle of the bottom of each U-shaped structure 20 is removed, and the STIs 14 under the middle of the bottom of each U-shaped structure 20 are also partly removed. Therefore, the III-V fin structures 28 are disconnected to each other, and a recess 30 is formed within each of the STIs 14. At this point, each of the STIs 14 has two III-V fin structures 28 disposed on, with a trench 32 between each of the III-V fin structures 28. Therefore, there are numerous trenches 32. Furthermore, the pitch of the III-V fin structures 28 is marked as $P_2$. The pitch of the III-V fin structures 28 is half of the pitch $P_1$ of the fins 12 shown in FIG. 1.

Figure 9:
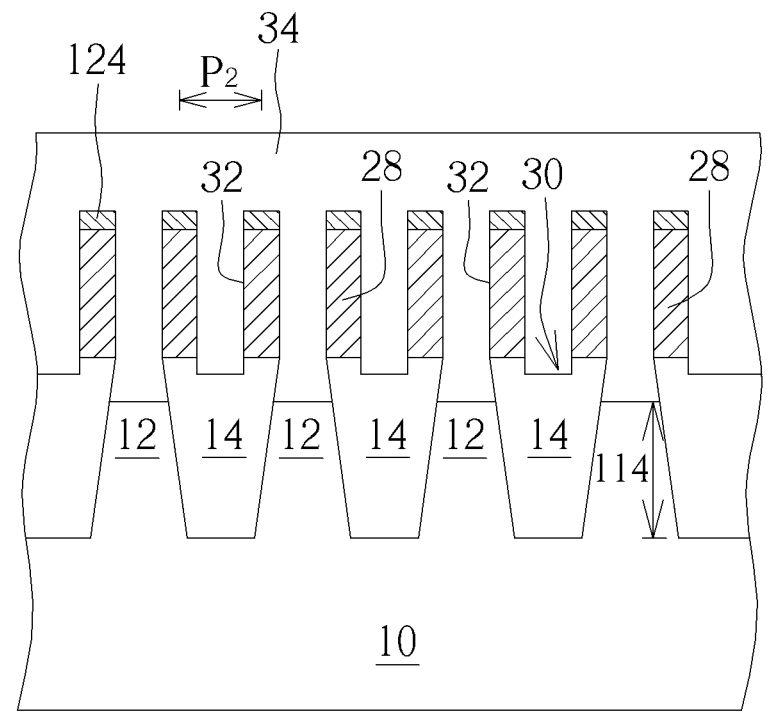
Figure 10:
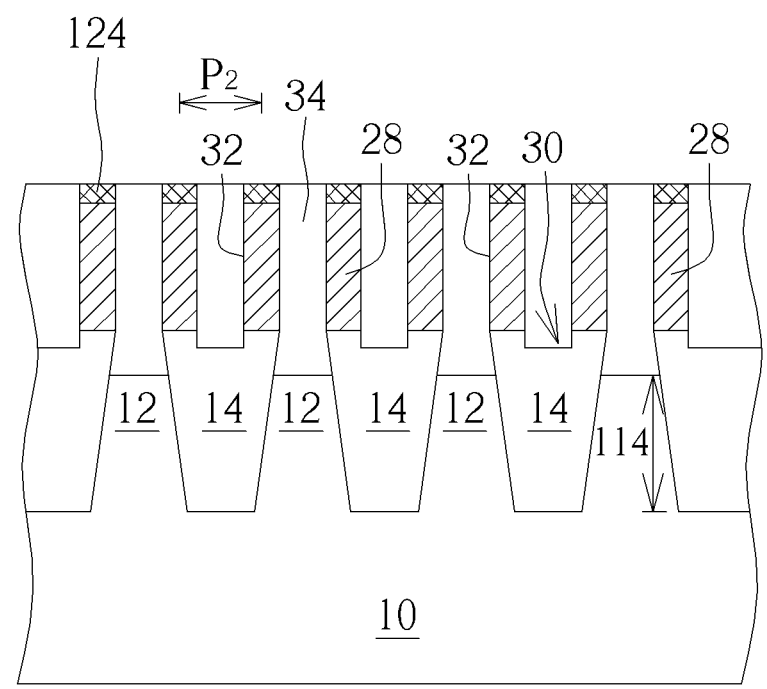
Figure 11:
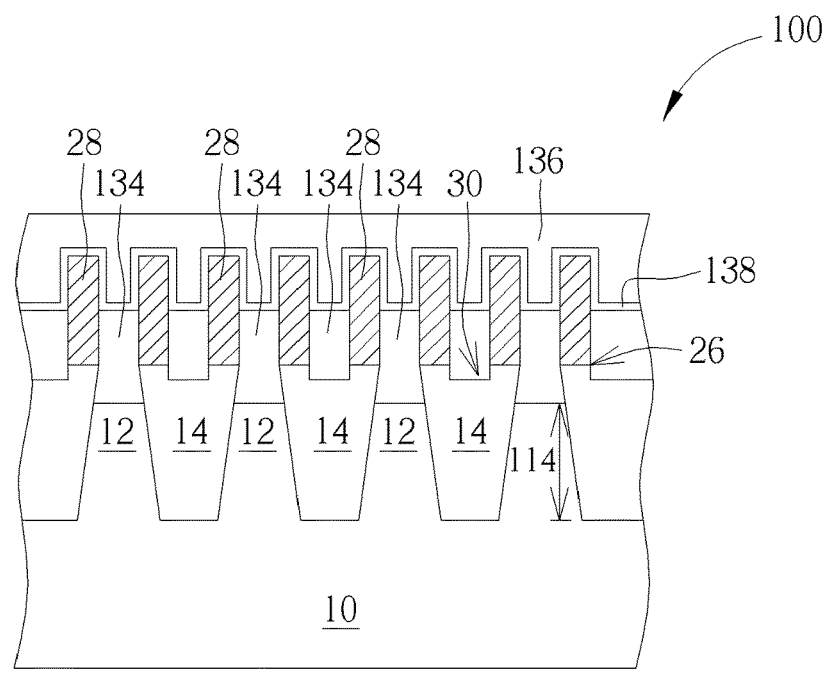

As shown in FIG. 9, an isolating layer 34 such as a silicon oxide layer is formed to cover the III-V fin structures 28, the second part 114 of the fins 12, and fill up the trenches 32. The isolating layer 34 may be silicon oxide. As shown in FIG. 10, the isolating layer 34 is planarized by taking the hard masks 124 as a stop layer. As shown in FIG. 11, the isolating layer 34 in each of the trenches 32 is shortened and the hard masks 124 are removed. The shortened isolating layer 34 in each of the trenches 32 serves as isolating structures 134 to isolate the III-V fin structures 28. The hard masks 124 and the isolating layer 34 can be removed or shortened by a SiCoNi process.

Moreover, an upper portion of each of the III-V fin structures 28 protrudes from the isolating structures 134. After that, a dummy gate structure (not shown) can be formed to cross each of the III-V fin structures 28. Subsequently, source/drain regions (not shown) are formed in the III-V fin structures 28 at two sides of the dummy gate structure. Then, an interlayer dielectric (not shown) is formed to cover the dummy gate structure. Next, the dummy gate structure is removed and replaced by a metal gate structure. The metal gate structure includes a metal gate 136 and a gate dielectric layer 138.

The method of fabricating III-V fin structures utilizes the fins 12 as mandrels of the III-V fin structures 28; therefore, the III-V fin structures 28 can be formed by self-aligning a group III-V material layer 16 followed by planarization of the group III-V material layer 16 and removal of the bottom of the U-shaped structures 20. As a result, the III-V fin structures 28 have smaller pitch than the fins 12.

FIG. 11 depicts a semiconductor device with III-V fin structures formed by utilizing the method of fabricating III-V fin structures of the present invention. As shown in FIG. 11, a semiconductor device with III-V fin structures 100 includes numerous fins 12, numerous STIs 14, and numerous III-V fin structures 28. Each of the STIs 14 is respectively disposed between the fins 12. Moreover, each of the STIs 14 has two III-V fin structures 28 disposed thereon. Each of the fins 12 is lower than the interface 26 between the III-V fin structures 28 and the STIs 14.

It is noteworthy that numerous isolating structures 134 are respectively disposed on each of the fins 12 and STIs 14, and between the III-V fin structures 28. The isolating structures 134 isolate the III-V fin structures 28. Furthermore, an upper portion of each of the III-V fin structures 28 protrudes from the isolating structures 134. A recess 30 is disposed within each of the STIs 14. Each of the recesses 30 is filled up by one of the isolating structures 134. Each of the recesses 30 is disposed between two III-V fin structures 28. Moreover, the III-V fin structures 28 do not overlap the fins 12. The isolating structures 134 on the fins 12 are thicker than the isolating structures 134 on the STIs 14 in the recess 30.

Figure 12:
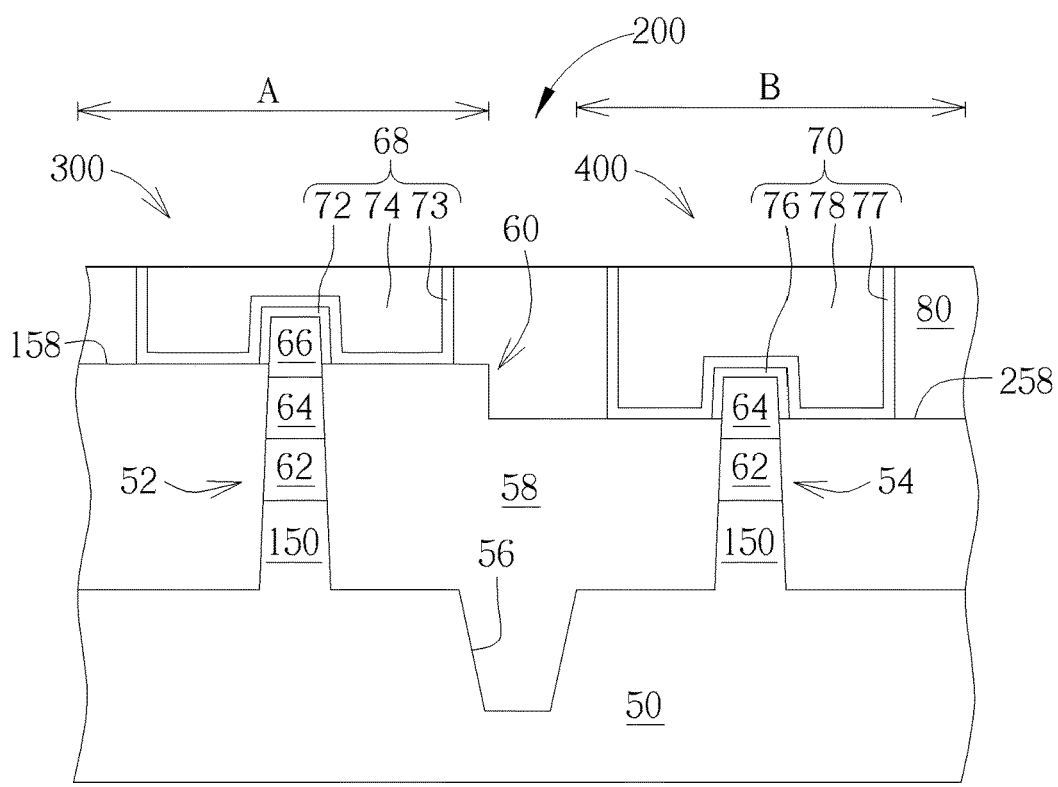
FIG. 12 shows a FinFET device with different band gap materials according to a second preferred embodiment of the present invention.

FIG. 12 shows a FinFET device with different band gap materials according to a second preferred embodiment of the present invention. As shown in FIG. 12, a FinFET device with different band gap materials 200 includes a core FinFet 300, and an I/O FinFet 400 disposed on a substrate 50. The substrate 50 is divided into a core region A and an I/O region B. The core FinFet 300 is within the core region A and the I/O FinFet 400 is within the I/O region B.

The core FinFet 300 includes a first fin structure 52, and the I/O FinFet 400 includes a second fin structure 54. The first fin structure 52 and the second fin structure 54 extend from the top surface of the substrate 50. A shallow trench 56 is disposed within the substrate 50 between the core region A and the I/O region B. An isolating layer 58 covers the substrate 50 and fills up the shallow trench 56. A first top surface 158 of the isolating layer 58 within the core region A is higher than a second top surface 258 of the isolating layer 58 within the I/O region B. Therefore, the first top surface 158 of the isolating layer 58 and the second top surface 258 of the isolating layer 58 form a step profile 60.

The first fin structure 52 and the second structure 54 are both surrounded by the isolating layer 58. The first fin structure 52 includes a protruding substrate 150, a barrier 62, a first group III-V material layer 64 and a second group III-V material layer 66 arranged from bottom to top. The second fin structure 54 includes the protruding substrate 150, the barrier 62, and the first group III-V material layer 64 arranged from bottom to top. The protruding substrate 150 is integral with the substrate 50 and protrudes from the substrate 50. The barrier 62 may be Ge. The first group III-V material layer 64 has a larger band gap than the second group III-V material layer 66. The first group III-V material layer 64 and the second group III-V material layer 66 may include, but are not limited to, gallium phosphide (GaP), gallium arsenide (GaAs), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium gallium arsenide antimony phosphide (InAsSbP), indium gallium aluminum phosphide (InGaAlP) or combinations of the foregoing. Other examples of the first group III-V material layer and the second group III-V material layer may be alloys of indium aluminum arsenide (InAlAs), indium aluminum arsenide antimony (InAlAsSb), indium aluminum arsenide phosphide (InAlAsP), or indium gallium arsenide phosphide (InGaAsP).

The substrate 50 is composed of a semiconductor material including Si, Ge, SiGe, SiC, SiGeC, or group III-V material. The first fin structure 52 is higher than the second fin structure 54, because the second fin structure 54 does not include the second group III-V material layer 66. The second group III-V material layer 66 of the first fin structure 52 protrudes from the isolating layer 58, and the first group III-V material layer 64 of the second fin structure 54 protrudes from the isolating layer 58. The core FinFet 300 further includes a first gate structure 68 crossing the second group III-V material layer 66 and source/drain regions (not shown) disposed within the second group III-V material layer 66. The I/O FinFet 400 includes a second gate structure 70 crossing the first group III-V material layer 64 and source/drain regions (not shown) disposed within the first group III-V material layer 64.

The first gate structure 68 may include a gate dielectric layer 72, a work function layer 73, and a metal gate 74. The second gate structure 70 may include a gate dielectric layer 76, a work function layer 77 and a metal gate 78. The gate dielectric layer 72 and the gate dielectric layer 76 may be silicon oxide, silicon nitride or high-k materials. The metal gate 78 and the metal gate 74 may be tungsten. An interlayer dielectric 80 covers the isolating layer 58 and surrounds the first gate structure 68 and the second gate structure 70. According to the FinFET device with different band gap materials of the present invention, the core FinFet 300 uses the group III-V material layer 66 having lower band gap to achieve high mobility. The I/O FinFet 400 utilizes the first group III-V material layer 64 having higher band gap to increase the breakdown voltage and decrease the current leakage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating III-V fin structures, comprising:
   providing a plurality of fins and a plurality of shallow trench isolations (STIs), wherein each of the fins are sandwiched by two of the STIs;
   performing a deposition process to conformally form a group III-V material layer encapsulating an upper portion of each of the fins and covering the STIs;
   removing part of the group III-V material layer to expose an end of each of the fins and divide the group III-V material layer into a plurality of U-shaped structures;
   removing a first part of each of the fins; and
   removing part of each of the U-shaped structures to segment each of the U-shaped structures into two III-V fin structures.

2. The method of fabricating III-V fin structures of claim 1, further comprising:
   after forming the group III-V material layer and before removing the first part of each of the fin, forming a silicon oxide layer to cover the group III-V material layer;
   planarizing the silicon oxide layer and the group III-V material layer to remove the part of the group III-V material layer, expose the end of each of the fins and form the U-shaped structures;
   shortening two ends of each of the U-shaped structures to form recesses between the silicon oxide layer and each of the fins; and
   forming a hard mask filling up the recesses.

3. The method of fabricating III-V fin structures of claim 2, further comprising:
   after forming the III-V fin structures, removing the hard mask.

4. The method of fabricating III-V fin structures of claim 1, further comprising:
   after forming the III-V fin structures, forming an isolating structure between two adjacent III-V fin structures, wherein an upper portion of each of the III-V fin structures protrudes from the isolating structure.

5. The method of fabricating III-V fin structures of claim 1, wherein the III-V fin structures are disposed on the STIs and do not overlap the fins.

6. The method of fabricating III-V fin structures of claim 1, wherein after removing the first part of each of the fins, a second part of each of the fins remains, and the second part of each of the fins is lower than the interface between the group III-V material layer and the STIs.

7. The method of fabricating III-V fin structures of claim 1, wherein the fins comprise silicon.

8. A semiconductor device with III-V fin structures, comprising:
   a plurality of fins;
   a plurality of shallow trench isolations (STIs), wherein each of the STIs is disposed between the fins;
   a plurality of III-V fin structures, wherein each of the STIs has two III-V fin structures disposed thereon; and
   a plurality of isolating structures disposed on the fins and STIs, and between the III-V fin structures, wherein an upper portion of each of the III-V fin structures protrudes from the isolating structures.

9. The semiconductor device with III-V fin structures of claim 8, wherein each of the fins is lower than the interface between the III-V fin structures and the STIs.

10. The semiconductor device with III-V fin structures of claim 8, further comprising a recess disposed within each of the STIs and filled up by the isolating structures.

11. The semiconductor device with III-V fin structures of claim 8, wherein the fins comprise silicon.

* * * * *